United States Patent
Campbell et al.

(10) Patent No.: US 8,929,080 B2
(45) Date of Patent: *Jan. 6, 2015

(54) IMMERSION-COOLING OF SELECTED ELECTRONIC COMPONENT(S) MOUNTED TO PRINTED CIRCUIT BOARD

(71) Applicant: International Business Machines Corporation, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Poughkeepsie, NY (US); Madhusudan K. Iyengar, Foster City, CA (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 121 days.

This patent is subject to a terminal disclaimer.

(21) Appl. No.: 13/788,987

(22) Filed: Mar. 7, 2013

(65) Prior Publication Data

US 2014/0085817 A1    Mar. 27, 2014

Related U.S. Application Data

(63) Continuation of application No. 13/627,216, filed on Sep. 26, 2012.

(51) Int. Cl.
*H05K 7/20* (2006.01)
*H01L 23/473* (2006.01)

(52) U.S. Cl.
CPC ........... *H05K 7/20* (2013.01); *H05K 7/20236* (2013.01); *H05K 7/20772* (2013.01)

USPC ...... 361/719; 361/699; 361/704; 165/104.33; 257/714; 257/715

(58) Field of Classification Search
USPC .................... 361/679.53, 699, 704, 719, 720; 165/104.33, 185; 257/714–715
See application file for complete search history.

(56) References Cited

U.S. PATENT DOCUMENTS

| 4,619,316 A | 10/1986 | Nakayama et al. |
| 4,698,728 A | 10/1987 | Tustaniwskyj et al. |

(Continued)

OTHER PUBLICATIONS

Anderson et al., "Hermetically Sealed, Field Removable Module Having an Integral Pump and Coolant Heat Exchanger for Forced Convection Immersion Cooling of Electronic Circuit Modules", IBM Technical Disclosure Bulletin No. IPCOM000109890D (Sep. 1, 1992).

(Continued)

*Primary Examiner* — Robert J Hoffberg
(74) *Attorney, Agent, or Firm* — Steven Chiu, Esq.; Kevin P. Radigan, Esq.; Heslin Rothenberg Farley & Mesiti P.C.

(57) ABSTRACT

A method is provided for pumped immersion-cooling of selected electronic components of an electronic system, such as a node or book of a multi-node rack. The method includes providing a housing assembly defining a compartment about the component(s) to be cooled, which is coupled to a first side of a printed circuit board. The assembly includes a first frame with an opening sized to accommodate the component(s), and a second frame. The first and second frames are sealed to opposite sides of the board via a first adhesive layer and a second adhesive layer, respectively. The printed circuit board is at least partially porous to a coolant to flow through the compartment, and the first frame, second frame, and first and second adhesive layers are non-porous with respect to the coolant, and provide a coolant-tight seal to the first and second sides of the printed circuit board.

11 Claims, 10 Drawing Sheets

(56) References Cited

U.S. PATENT DOCUMENTS

| | | |
|---|---|---|
| 4,704,658 A | 11/1987 | Yokouchi et al. |
| 5,131,233 A | 7/1992 | Cray et al. |
| 5,285,347 A | 2/1994 | Fox et al. |
| 6,193,905 B1 | 2/2001 | Yamada et al. |
| 6,687,124 B2 | 2/2004 | Ostby |
| 7,983,040 B2 | 7/2011 | Campbell et al. |
| 8,186,519 B2 * | 5/2012 | Tsujioka et al. ........... 210/510.1 |
| 2010/0290190 A1 | 11/2010 | Chester et al. |
| 2013/0044431 A1 * | 2/2013 | Koeneman ................... 361/699 |
| 2014/0085823 A1 * | 3/2014 | Campbell et al. ............. 361/701 |

OTHER PUBLICATIONS

Campbell et al., "Immersion-Cooling of Selected Electronic Component(s) Mounted to a Printed Circuit Board", U.S. Appl. No. 13/627,216, filed Sep. 26, 2012.

* cited by examiner

IMMERSION-COOLING OF SELECTED ELECTRONIC COMPONENT(S) MOUNTED TO PRINTED CIRCUIT BOARD

CROSS-REFERENCE TO RELATED APPLICATION

This application is a continuation of U.S. Ser. No. 13/627,216, filed Sep. 26, 2012, and entitled "Immersion-Cooling of Selected Electronic Component(s) Mounted to Printed Circuit Board", and which is hereby incorporated herein by reference in its entirety.

BACKGROUND

The power dissipation of integrated circuit chips, and the modules containing the chips, continues to increase, for instance, to achieve continued increase in processor performance. This trend poses cooling challenges at the module and system levels.

In many large server applications, processors along with their associated electronics (e.g., memory, disk drives, power supplies, etc.) are packaged in removable drawer configurations stacked within an electronics rack or frame comprising information technology (IT) equipment. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer or subsystem by providing greater airflow, for example, through the use of a more powerful air moving device or by increasing the rotational speed (i.e., RPMs) of an existing air moving device. However, this approach is becoming problematic, particularly in the context of a computer center installation (i.e., data center).

The sensible heat load carried by the air exiting the rack is stressing the capability of the room air-conditioning to effectively handle the load. This is especially true for large installations with "server farms" or large banks of computer racks located close together. In such installations, liquid-cooling is an attractive technology to manage the higher heat fluxes. The liquid absorbs the heat dissipated by the components/modules in an efficient manner. Typically, the heat is ultimately transferred from the liquid to an outside environment, whether air or other liquid.

BRIEF SUMMARY

The shortcomings of the prior art are overcome and additional advantages are provided by, in aspect, a method of facilitating cooling of an electronic system is provided. The method includes: providing a housing assembly defining a compartment about the at least one electronic component, the at least one electronic component being coupled to a first side of a printed circuit board. Providing the housing assembly includes: providing a first frame comprising at least one opening sized to accommodate the at least one electronic component therein, and coupling the first frame to the first side of the printed circuit board employing a first adhesive layer between the first frame and the printed circuit board; providing a second frame and coupling the second frame to a second side of the printed circuit board employing a second adhesive layer to seal the second frame to the second side of the printed circuit board, wherein the first side and the second side of the printed circuit board are opposite sides of the printed circuit board; and wherein the printed circuit board is at least partially porous to a coolant to flow through the compartment for cooling the at least one electronic component, and wherein the first frame, the second frame, the first adhesive layer, and the second adhesive layer, are non-porous with respect to the coolant and provide a coolant-tight seal to the first side and the second side of the printed circuit board.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
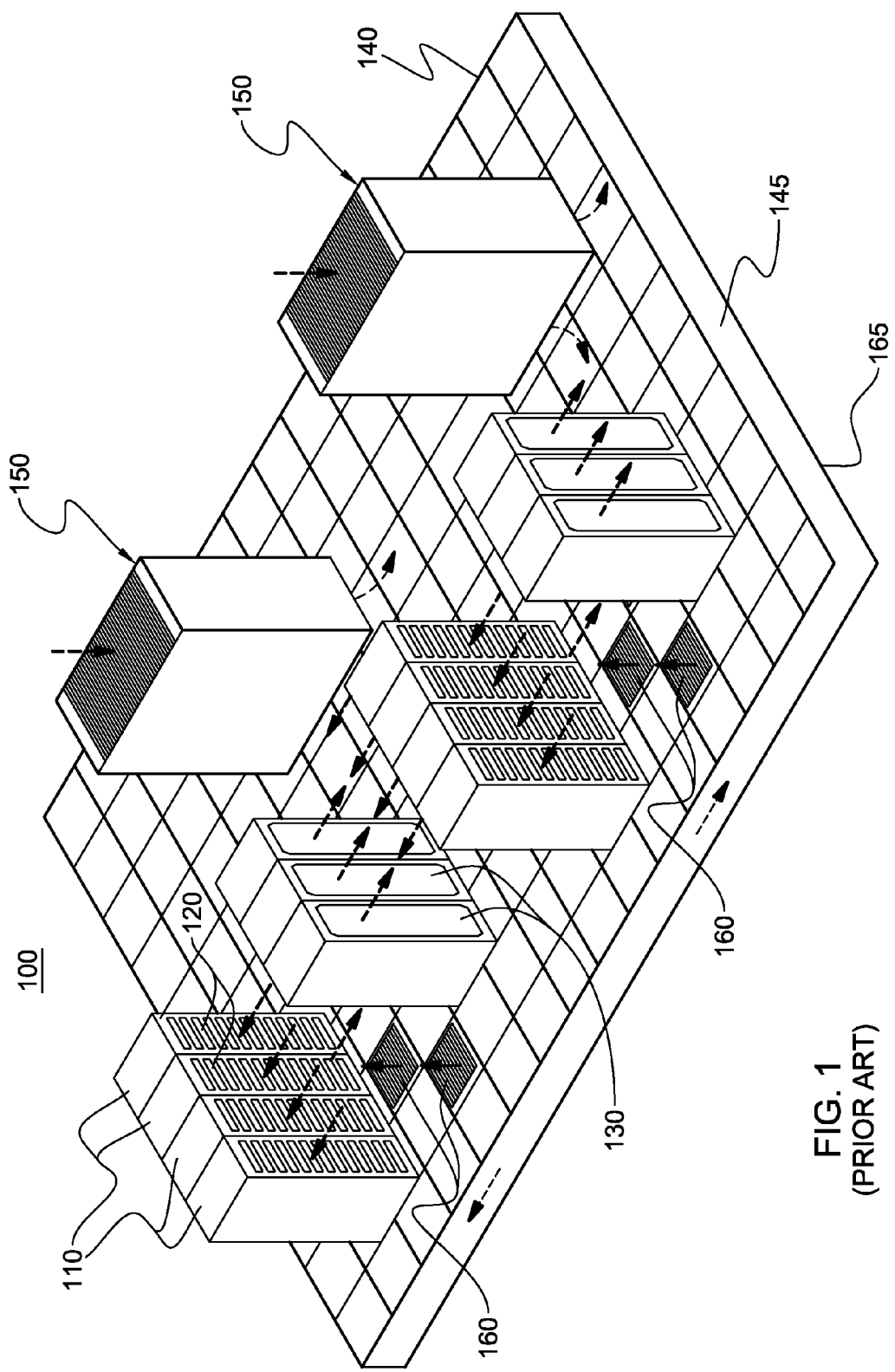
FIG. 1 depicts one embodiment of a conventional raised floor layout of an air-cooled computer installation.

As used herein, the terms "electronics rack", "rack-mounted electronic equipment", and "rack unit" are used interchangeably, and unless otherwise specified include any housing, frame, rack, compartment, blade server system, etc., having one or more heat-generating components of an electronic system, such as a computer system or information technology equipment, and may include, for example, a stand alone computer processor having high-, mid- or low-end processing capability. In one embodiment, an electronics rack may comprise a portion of an electronic system, a single electronic system, or multiple electronic systems, for example, in one or more sub-housings, blades, books, drawers, nodes, compartments, etc., each having one or more heat-generating electronic components disposed therein. An electronic system(s) within an electronics rack may be movable or fixed, relative to the electronics rack, with rack-mounted electronic drawers and blades of a blade center system being two examples of electronic systems (or subsystems) of an electronics rack to be cooled.

"Electronic component" refers to any heat generating electronic component of, for example, an electronic system requiring cooling. By way of example, an electronic component may comprise one or more integrated circuit dies and/or other electronic devices to be cooled, including one or more processor dies, memory dies or memory support dies. As a further example, the electronic component may comprise one or more bare dies or one or more packaged dies disposed on a common carrier. Further, unless otherwise specified herein, the terms "liquid-cooled cold plate", or "liquid-cooled structure" each refer to any conventional thermally conductive structure having a plurality of channels or passageways formed therein for flowing of liquid-coolant therethrough.

As used herein, a "liquid-to-liquid heat exchanger" or a "dielectric coolant-to-secondary coolant heat exchanger" may comprise, for example, two or more coolant flow paths, formed of thermally conductive tubing (such as copper or other tubing) in thermal or mechanical contact with each other. Size, configuration and construction of the heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of these coolants may comprise a brine, a dielectric liquid, a fluorocarbon liquid, a liquid metal, or other similar coolant, or a refrigerant, while still maintaining the advantages and unique features of the present invention.

Reference is made below to the drawings, which are not drawn to scale for ease of understanding of the various aspects of the present invention, wherein the same reference numbers used throughout different figures designate the same or similar components.

As shown in FIG. 1, in a raised floor layout of an air-cooled data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the backs, i.e., air outlet sides 130, of the electronics racks. Each electronics rack 110 may have one or more air-moving devices (e.g., fans or blowers) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within data center 100. Room air is taken into each air conditioning unit 150 near an upper portion thereof. This room air may comprise (in part) exhausted air from the "hot" aisles of the computer installation defined by opposing air outlet sides 130 of the electronics racks 110.

Figure 2:
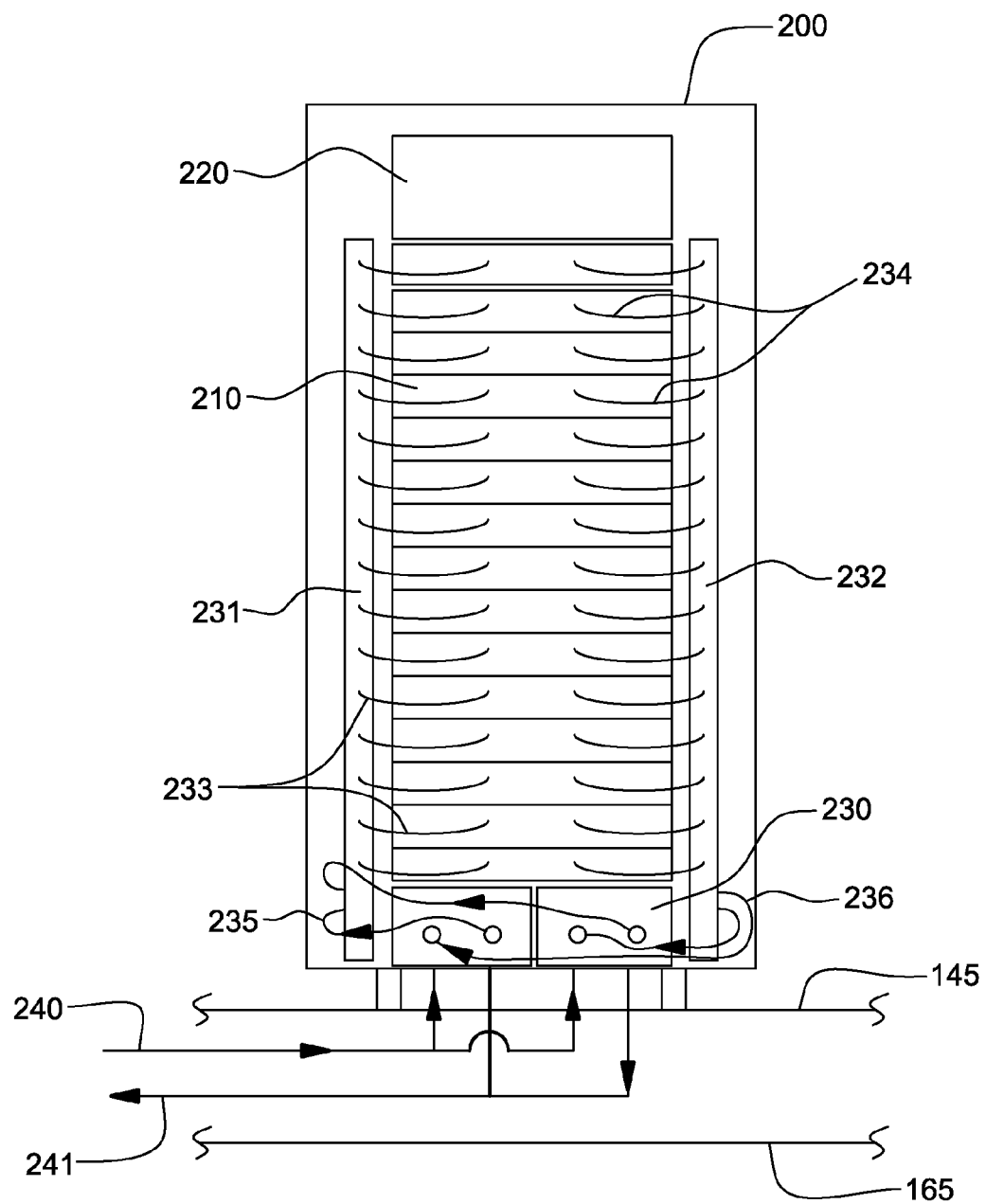
FIG. 2 is a front elevational view of one embodiment of a liquid-cooled electronics rack comprising multiple electronic systems to be cooled via a cooling apparatus, in accordance with one or more aspects of the present invention.

FIG. 2 depicts one embodiment of a liquid-cooled electronics rack 200 comprising a cooling apparatus. In one embodiment, liquid-cooled electronics rack 200 comprises a plurality of electronic systems 210, which may be processor or server nodes (in one embodiment). A bulk power assembly 220 is disposed at an upper portion of liquid-cooled electronics rack 200, and two modular cooling units (MCUs) 230 are positioned in a lower portion of the liquid-cooled electronics rack for providing system coolant to the electronic systems. In the embodiments described herein, the system coolant is assumed to be water or an aqueous-based solution, by way of example only.

In addition to MCUs 230, the cooling apparatus depicted includes a system coolant supply manifold 231, a system coolant return manifold 232, and manifold-to-node fluid connect hoses 233 coupling system coolant supply manifold 231 to electronic subsystems 210 (for example, to cold plates (see FIG. 5) or dielectric coolant-to-secondary coolant heat exchangers (see FIG. 6) disposed within the systems) and node-to-manifold fluid connect hoses 234 coupling the individual electronic systems 210 to system coolant return manifold 232. Each MCU 230 is in fluid communication with system coolant supply manifold 231 via a respective system coolant supply hose 235, and each MCU 230 is in fluid communication with system coolant return manifold 232 via a respective system coolant return hose 236.

Heat load of the electronic systems 210 is transferred from the system coolant to cooler facility coolant within the MCUs 230 provided via facility coolant supply line 240 and facility coolant return line 241 disposed, in the illustrated embodiment, in the space between raised floor 145 and base floor 165.

Figure 3:
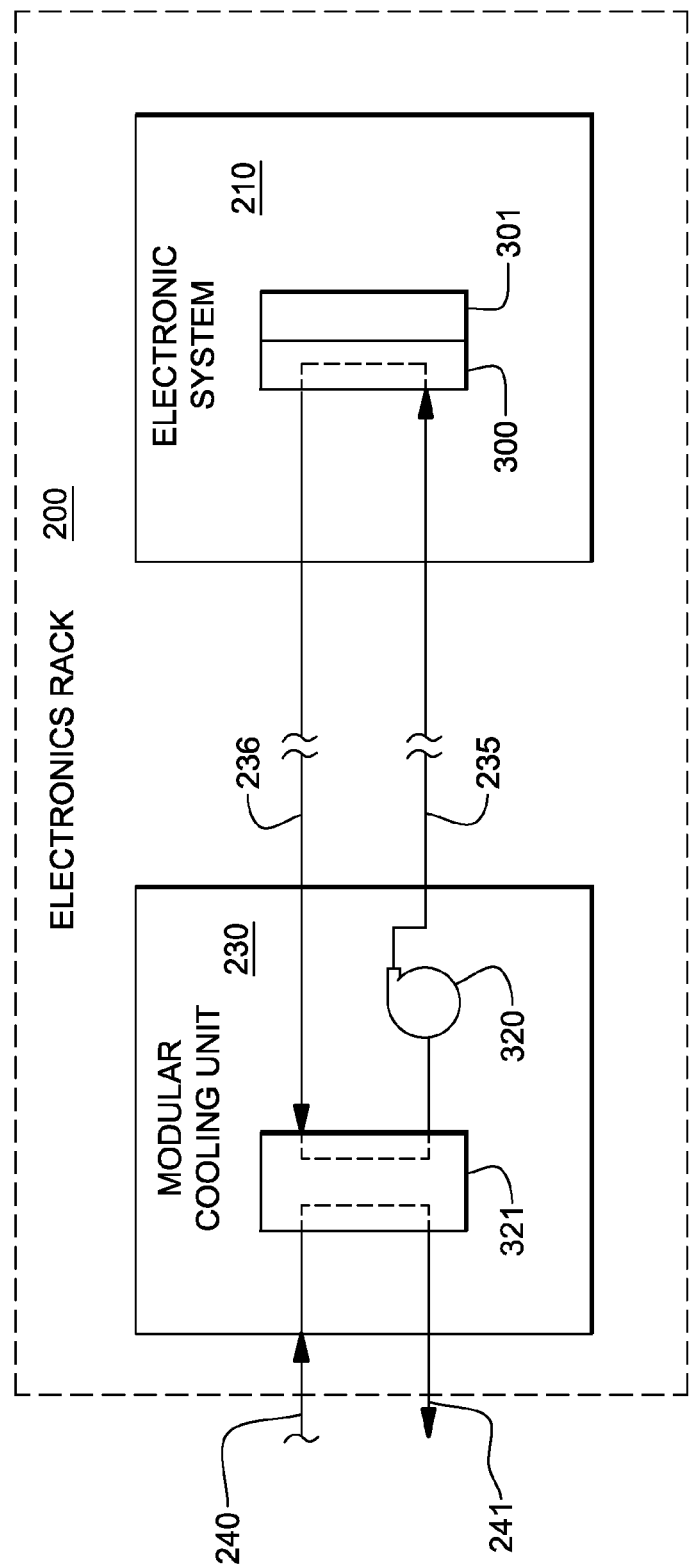
FIG. 3 is a schematic of an electronic system of an electronics rack and one approach to liquid-cooling of an electronic component with the electronic system, wherein the electronic component is indirectly liquid-cooled by system coolant provided by one or more modular cooling units disposed within the electronics rack, in accordance with one or more aspects of the present invention.

FIG. 3 schematically illustrates one cooling approach using the cooling apparatus of FIG. 2, wherein a liquid-cooled cold plate 300 is shown coupled to an electronic component 301 of an electronic system 210 within the liquid-cooled electronics rack 200. Heat is removed from electronic component 301 via system coolant circulating via pump 320 through liquid-cooled cold plate 300 within the system coolant loop defined, in part, by liquid-to-liquid heat exchanger 321 of modular cooling unit 230, hoses 235, 236 and cold plate 300. The system coolant loop and modular cooling unit are designed to provide coolant of a controlled temperature and pressure, as well as controlled chemistry and cleanliness to the electronic systems. Furthermore, the system coolant is physically separate from the less controlled facility coolant in lines 240, 241, to which heat is ultimately transferred.

Figure 4:
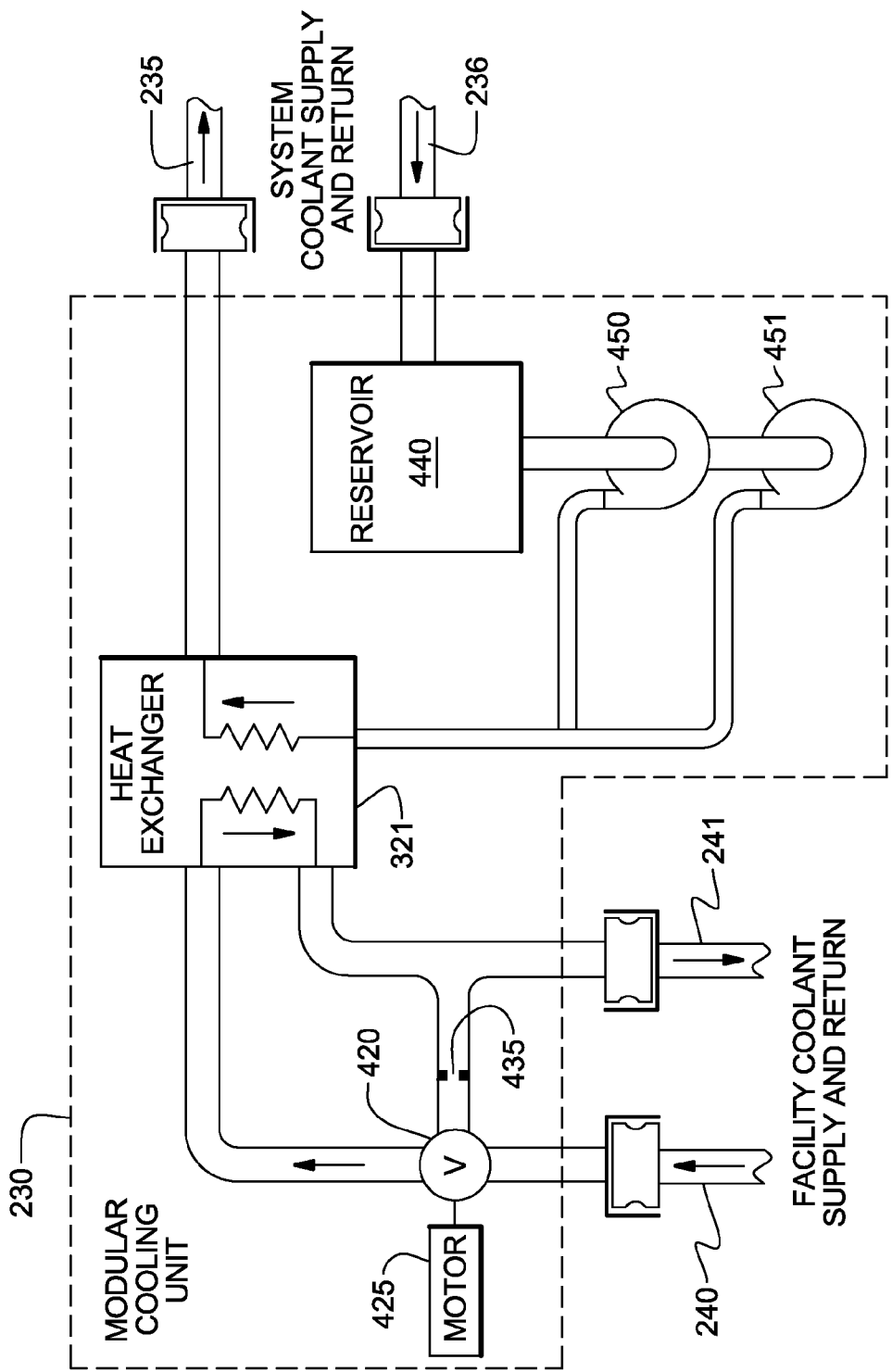
FIG. 4 is a schematic of one embodiment of a modular cooling unit for a liquid-cooled electronics rack such as illustrated in FIG. 2, in accordance with one or more aspects of the present invention.

FIG. 4 depicts one detailed embodiment of a modular cooling unit 230. As shown in FIG. 4, modular cooling unit 230 includes a facility coolant loop, wherein building chilled, facility coolant is provided (via lines 240, 241) and passed through a control valve 420 driven by a motor 425. Valve 420 determines an amount of facility coolant to be passed through heat exchanger 321, with a portion of the facility coolant possibly being returned directly via a bypass orifice 435. The modular cooling unit further includes a system coolant loop with a reservoir tank 440 from which system coolant is pumped, either by pump 450 or pump 451, into liquid-toliquid heat exchanger 321 for conditioning and output thereof, as cooled system coolant to the electronics rack to be cooled. Each modular cooling unit is coupled to the system supply manifold and system return manifold of the liquid-cooled electronics rack via the system coolant supply hose 235 and system coolant return hose 236, respectively.

Figure 5:
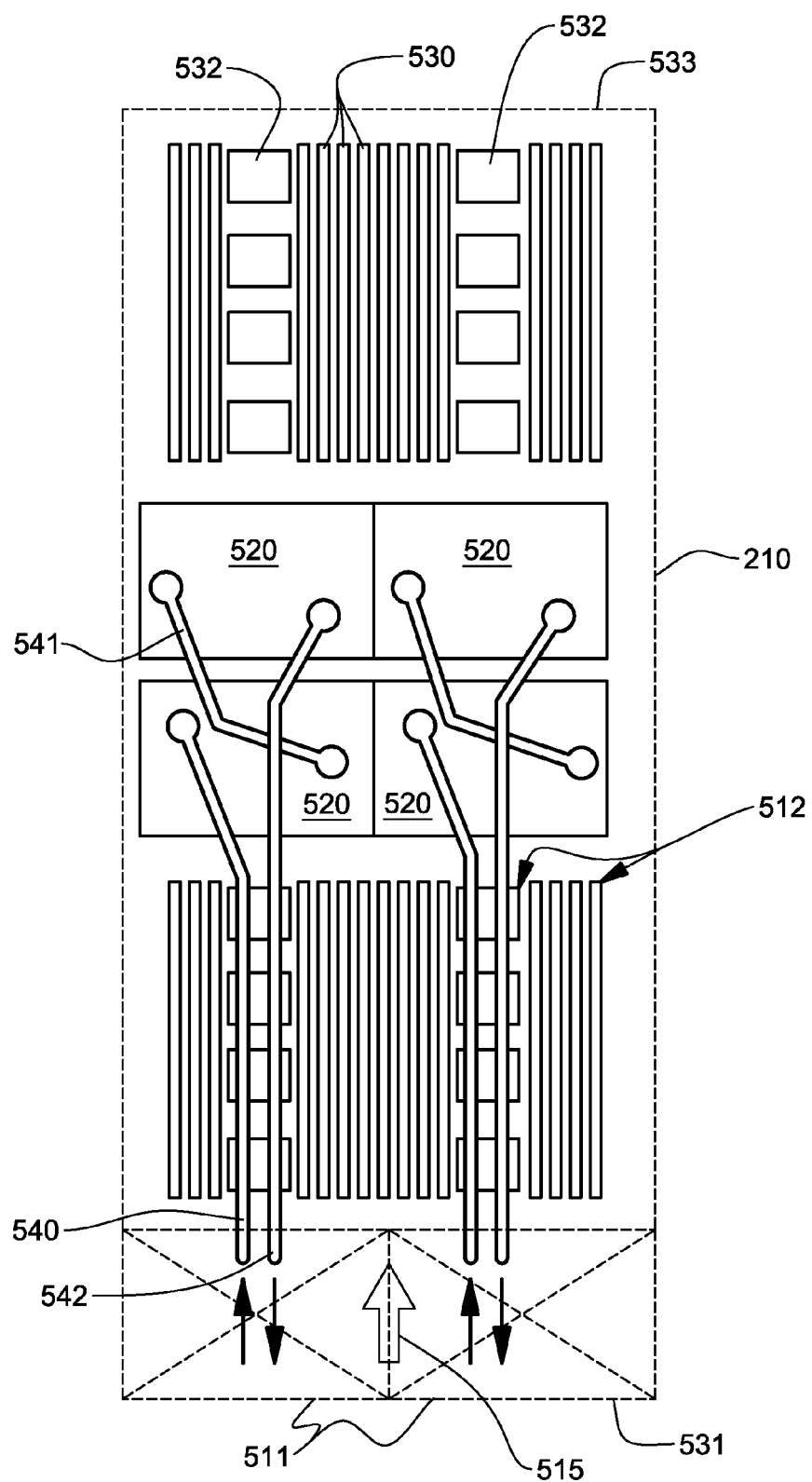
FIG. 5 is a plan view of one embodiment of an electronic system layout illustrating an air and liquid-cooling approach for cooling electronic components of the electronic system, in accordance with one or more aspects of the present invention.

FIG. 5 depicts another cooling approach, illustrating one embodiment of an electronic system 210 component layout wherein one or more air moving devices 511 provide forced air flow 515 in normal operating mode to cool multiple electronic components 512 within electronic system 210. Cool air is taken in through a front 531 and exhausted out a back 533 of the drawer. The multiple components to be cooled include multiple processor modules to which liquid-cooled cold plates 520 are coupled, as well as multiple arrays of memory modules 530 (e.g., dual in-line memory modules (DIMMs)) and multiple rows of memory support modules 532 (e.g., DIMM control modules) to which air-cooled heat sinks may be coupled. In the embodiment illustrated, memory modules 530 and the memory support modules 532 are partially arrayed near front 531 of electronic system 210, and partially arrayed near back 533 of electronic system 210. Also, in the embodiment of FIG. 5, memory modules 530 and the memory support modules 532 are cooled by air flow 515 across the electronics system.

The illustrated cooling apparatus further includes multiple coolant-carrying tubes connected to and in fluid communication with liquid-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides liquid-coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

As computing demands continue to increase, heat dissipation requirements of electronic components, such as microprocessors and memory modules are also rising. This has motivated the development of the application of single-phase liquid-cooling solutions such as described above. Single-phase liquid-cooling, however, has certain some issues. Sensible heating of the liquid as it flows along the cooling channels and across cold plates connected in series results in a temperature gradient. To maintain a more uniform temperature across the heat-generating component(s), temperature change in the liquid should be minimized. This requires the liquid to be pumped at higher flow rates, consuming more pumping power, and thus leading to a less efficient system. Further, it is becoming increasingly challenging to cool all the heat sources on a server or electronic system using pumped liquid and an indirect cooling approach, for example, due to the density and number of components, such as controller chips, I/O components and memory modules. The small spaces between components to be cooled can make indirect cooling a complex design and fabrication problem and significantly raise the overall cost of the cooling solution.

Immersion-cooling is one possible solution to these issues. In immersion-cooling, the components to be cooled are immersed in a dielectric fluid that dissipates heat, for example, through boiling. The vapor is then condensed by a secondary, rack-level working (or system) coolant using node or module-level condensers or heat exchangers, as explained below.

Direct immersion-cooling of electronic components of an electronic system of the rack unit using dielectric coolant (e.g., a liquid dielectric coolant) advantageously reduces the need for forced air-cooling of the system and enables a hybrid cooling of the electronics rack, wherein selected components of the electronic systems are immersion-cooled using a pumped dielectric coolant. Although indirect liquid-cooling, such as described above in connection with FIGS. 3 and 5, has certain advantages due to the low cost and wide availability of water as a coolant, as well as its superior thermal and hydraulic properties, where possible and viable, the use of dielectric fluid to selectively immersion-cool certain components of a system may offer several unique benefits.

For example, the use of a dielectric coolant that condenses at a temperature above typical outdoor ambient air temperature would enable data center cooling architectures which do not require energy intensive refrigeration chillers. Yet other practical advantages, such as the ability to ship a coolant filled electronic system or subsystem, may offer benefit over water-cooled approaches such as depicted in FIGS. 3 & 5, which require shipping dry and the use of a fill and drain protocol to insure against freeze damage during transport. Also, the use of selective immersion-cooling may, in certain cases, allow for greater compaction of electronic components at the electronic subsystem level and/or electronic rack level since conductive cooling structures might be eliminated. Unlike corrosion sensitive water-cooled systems, chemically inert dielectric coolant (employed with an immersion-cooling approach such as described herein) would not mandate copper as the primary thermally conductive wetted metal. Lower cost and lower mass aluminum structures could replace copper structures wherever thermally viable, and the mixed wetted metal assemblies would not be vulnerable to galvanic corrosion, such as in the case of a water based cooling approach. For at least these potential benefits, dielectric fluid immersion-cooling of one or more electronic components of the electronic systems (for example, nodes, books, severs, etc.) of an electronics rack may offer significant energy efficiency and higher performance cooling benefits, compared with currently available hybrid air and indirect water cooled systems such as described above in connection with FIG. 5.

In the example discussed below, the dielectric coolant may comprise, for instance, any one of a variety of commercially available dielectric coolants. For example, any of the Fluorinert™ or Novec™ fluids manufactured by 3M Corporation (e.g., FC-72, FC-86, HFE-7000, and HFE-7200) could be employed. Alternatively, a refrigerant such as R-134a or R-245fa may be employed if desired.

Figure 6:
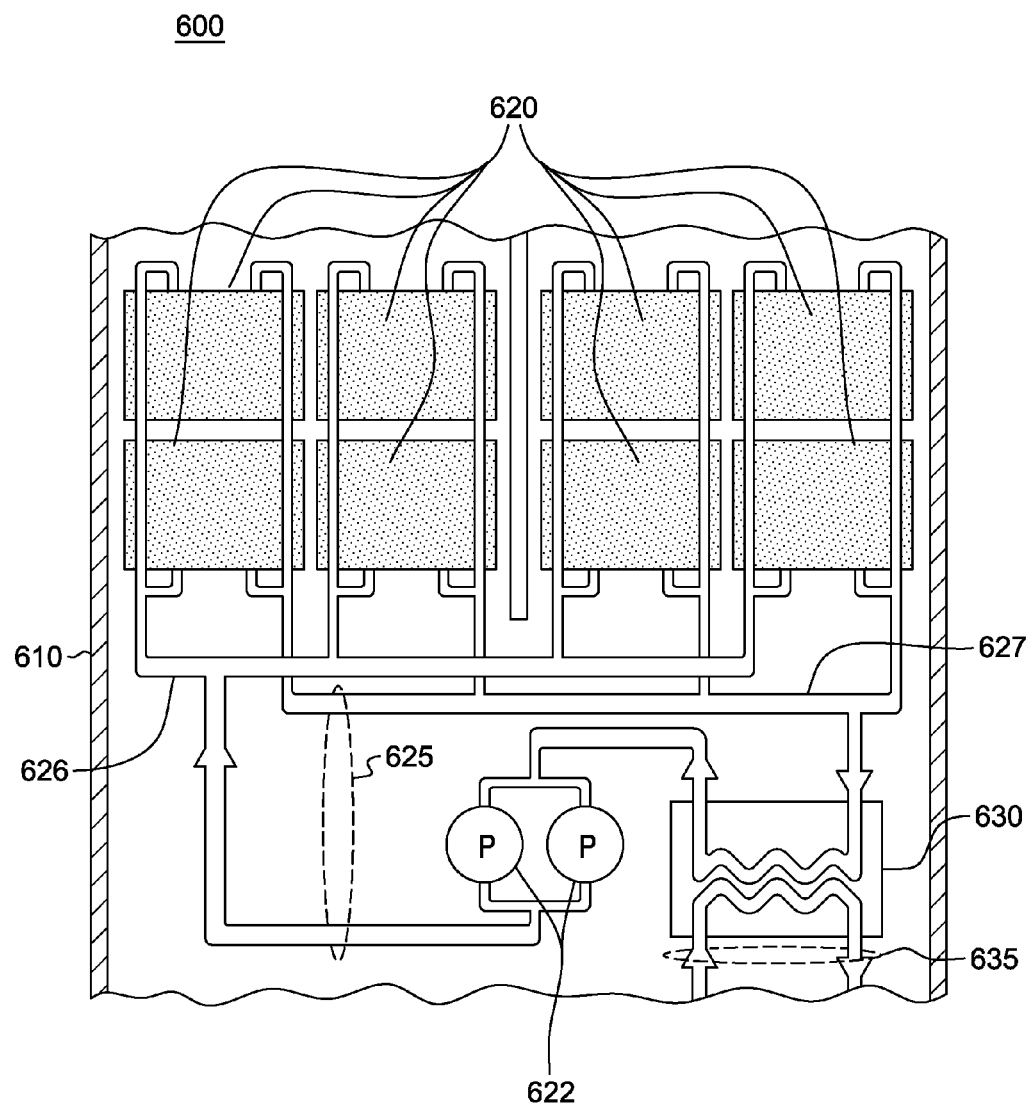
FIG. 6 is a partial plan view of another embodiment of an electronic system layout, and an electronic system-level cooling apparatus, in accordance with one or more aspects of the present invention.

FIG. 6 is a partial plan view of one embodiment of a hybrid coolant and air-cooled electronics rack, generally denoted 600, comprising one or more electronic systems 610, at least one (or each of) which may employ a cooling apparatus such as depicted, comprising housing assemblies 620, which facilitate immersion-cooling of selected electronic components of the electronic system (or subsystem, drawer, node, etc.). Hybrid coolant and air-cooled electronics rack 600 embodies, in one embodiment, a hybrid cooling approach wherein certain electronic components of the electronic system are air-cooled, in a manner similar to that described above in connection with FIG. 5, and selected electronic components (such as processors, and the supporting components thereof) are immersion-cooled via a pumped dielectric coolant. In the illustrated embodiment, each housing assembly 620 of the cooling apparatus forms a compartment about one or more respective electronic components, such as one or more processors, to be immersion-cooled via pumped dielectric coolant circulated through a dielectric fluid loop 625 by redundant coolant pumps 622. The cooling apparatus further includes a dielectric coolant-to-secondary coolant heat exchanger 630, which facilitates transfer of heat from the heated dielectric coolant within the illustrated electronic system or node to a secondary coolant within a secondary coolant loop 635 of the coolant-cooled electronic system. In one embodiment, the illustrated electronic system may be one of a plurality of such electronic systems within an electronics rack, and the secondary coolant may comprise a system coolant provided within the electronics rack, for instance, in a manner such as described above in connection with FIGS. 2-5. In one embodiment, this secondary coolant may comprise water.

In operation, dielectric coolant is circulated within electronic system 610 through the housing assemblies 620 for direct immersion-cooling within each assembly of one or more electronic components (as described further below). Redundant pumps 622 facilitate the circulation of dielectric coolant through dielectric coolant loop 625 by pumping dielectric coolant via a dielectric coolant supply manifold 626 to the respective housing assemblies 620. Single-phase or two-phase heated dielectric coolant egresses from housing assemblies 620 and is returned via a dielectric coolant return manifold 627 to dielectric coolant-to-secondary coolant heat exchanger 630, where heat extracted from the immersion-cooled electronic components is dissipated to the secondary coolant flowing through secondary coolant loop 635. As noted, the illustrated hybrid coolant and air-cooled electronic system of FIG. 6 is, in one example, one of a plurality of such electronic systems with an electronics rack. Multiple such systems may each provide selective immersion-cooling of particular electronic components thereof in a manner described herein, while other components of the electronic system are air-cooled, for instance, such as described above in connection with the electronic system layout of FIG. 5. In one embodiment, the dielectric coolant passing through the respective housing assemblies immersion-cools the multiple components of or within, for example, an electronic module. Heat may be extracted from the components using a combination of single-phase and two-phase heat transfer processes. Thus, FIG. 6 illustrates a hybrid cooling of components approach, wherein pumped dielectric coolant immersion-cools selected components, with the extracted heat being dissipated within the system or node-level, secondary coolant-cooled heat exchanger 630.

Figure 7:
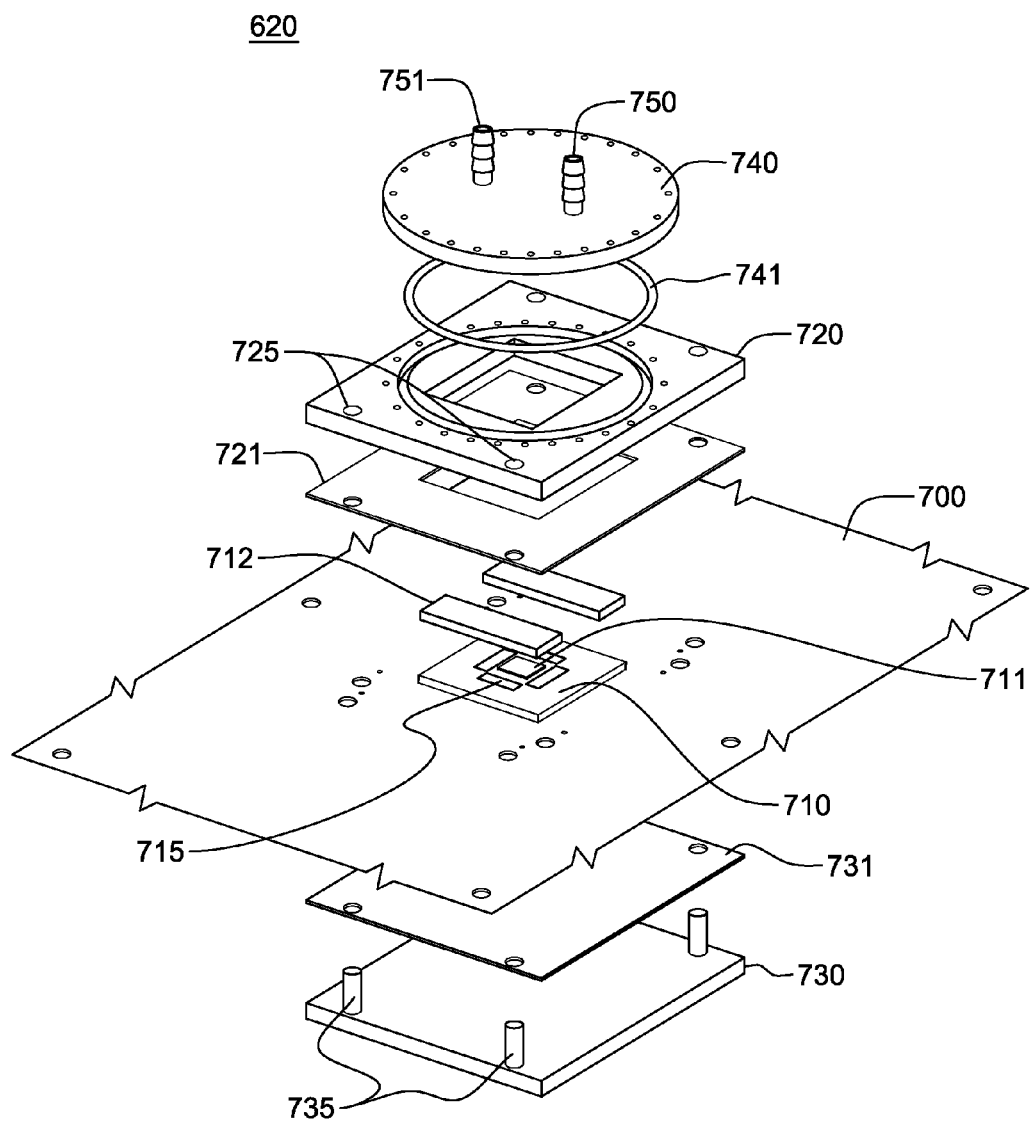
FIG. 7 is an exploded view partially illustrating electronic components of an electronic system and a housing assembly of a cooling apparatus, in accordance with one or more aspects of the present invention.

Generally stated, the above-described hybrid cooling approach is facilitated by a novel configuration for a housing assembly 620, which facilitates defining a compartment about one or more electronic components of an electronic system, such as illustrated in FIG. 6 and described above. One embodiment of the housing assembly is depicted in FIGS. 7-8C and described below. Referring collectively to FIGS. 7-8C, the illustrated housing assembly creates a compartment through which dielectric coolant may immersion-cool one or more components on, for example, a printed circuit board 700, such as the motherboard of an electronic system, wherein the printed circuit board is at least partially porous to the dielectric coolant, as would be the case with an organic-based printed circuit board. Printed circuit board 700 may comprise, in one example, part of a server node, such as described above in connection with FIG. 5. However, as noted above in connection with FIG. 6, the liquid-cooled cold plates of the embodiment of FIG. 5 are replaced with housing assemblies 620, which facilitate immersion-cooling via pumped dielectric coolant flow over one or more electronic components of the electronic system.

In the embodiment of FIGS. 7-8C, printed circuit board 700 supports a substrate 710 which comprises, in this example, multiple electronic components 711, 715. By way of example, electronic component 711 may comprise a high-heat-generating electronic component, such as a processor, and electronic components 715 may comprise lower-heat-generating electronic components, such as (for example) capacitors. Porous foam elements 712 may be provided to facilitate restricting dielectric coolant flow to the region of the coolant flow gap (described below) over electronic component 711, such as illustrated in FIG. 8C.

In the embodiment illustrated, housing assembly 620 includes a first, upper frame 720, and a second, lower frame 730. First, upper frame 720 includes a central opening sized to accommodate the one or more electronic components 711, 715 therein, and is configured to couple to a first side 801 (FIGS. 8B & 8C) of printed circuit board 700. Second, lower frame 730 couples to a second, opposite side 802 of the printed circuit board 700. In this embodiment, second, lower frame 730 includes alignment pins 735, which pass through respective alignment openings in printed circuit board 700, and respective alignment holes 725 in the first, upper frame 720, and thereby facilitate aligning the upper and lower frames together. A first adhesive layer 721 is disposed between first, upper frame 720 and the first side of printed circuit board 700, and a second adhesive layer 731 is disposed between the second, lower frame 730 and the second side of printed circuit board 700. In implementation, the first frame, second frame, first adhesive layer, and second adhesive layer, are each non-porous with respect to the dielectric fluid, and together define a coolant-tight seal at the first side and the second side of the printed circuit board. In the embodiment illustrated, second, lower frame 730 is a plate structure and, except for alignment openings, second adhesive layer 731 is a flat, solid layer which facilitates preventing coolant from escaping through the second side of printed circuit board 700. In one embodiment, the first adhesive layer is a first epoxy layer and the second adhesive layer is a second epoxy layer, and the first and second epoxy layers may respectively penetrate, for example, the first side and the second side of the printed circuit board and form the fluid-tight seal between the first and second sides of the circuit board.

Dielectric coolant is introduced into the compartment (defined by the opening in the first, upper frame 720) receiving the electronic components via a coolant inlet 750 and a coolant outlet 751 provided, in this example, in a cover 740 which seals to first, upper frame 720 via, in part, a sealing gasket 741. In the illustrated embodiment, sealing gasket 741 resides at least partially within a respective channel formed within first, upper frame 720. By way of example, coolant inlet 750 and coolant outlet 751 may be configured with hose barbs to facilitate coolant-tight coupling of hoses or tubes (not shown) of the dielectric coolant loop to the coolant inlet and 750 coolant outlet 751 for supply of dielectric coolant to the housing assembly in a manner such as described above in connection with FIG. 6.

Note that upper frame 720 may be tightened to the printed circuit board 700 above the lower frame 730 using, for example, the posts 735 projecting from the lower frame. The cover 740 may attach to the upper frame around the periphery of the O-ring seal (e.g., using attachment screws or bolts). Coolant enters through the coolant inlet 750 and is distributed into a plenum that is on one side of the electronic component to be cooled. The fluid then flows across the component in a thin coolant flow gap that has been created over the component between the component 711 and the underside of the cover 740. The liquid coolant may boil off the surface of the component, and a two-phase mixture may leave the component surface and enter an exhaust plenum within the compartment, and thereafter leave the compartment through the coolant outlet 751. Foam 712 may be placed between the cover 740 and the printed circuit board 700 on both sides of the substrate 710 or electronic component 711 to prevent the bypass of dielectric fluid from the electronic components. The foam may be lightly compressed between the cover and the board 700 or substrate 710. The foam can breathe, and becomes filled with the dielectric fluid during operation. If necessary, the porous foam filled with dielectric coolant can cool low-power electronics 715, such as capacitors, which may also be disposed around the higher-heat-producing electronic component 711.

Figure 8A:
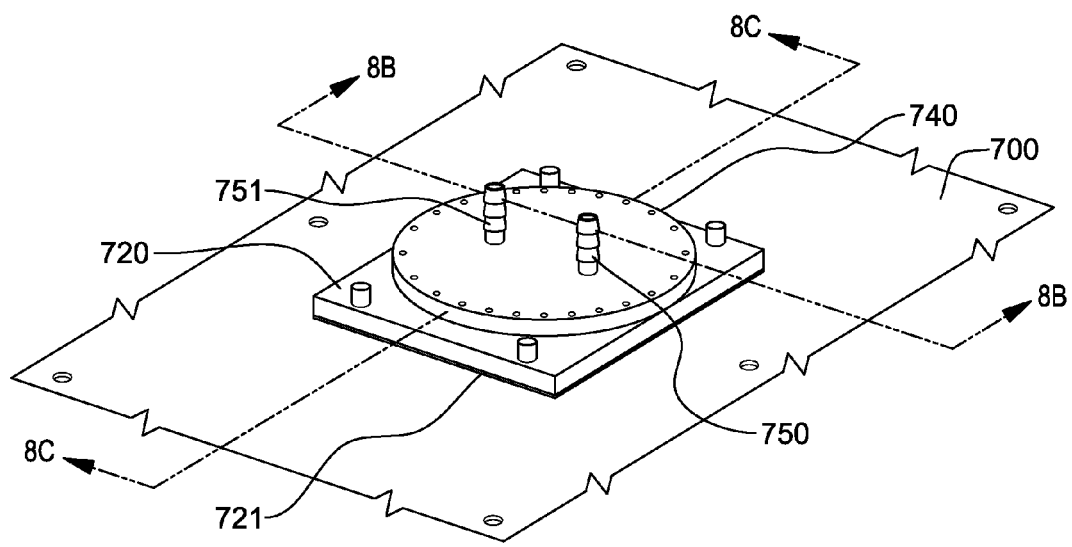
FIG. 8A depicts an assembled view of the partial electronic system and housing assembly of FIG. 7, in accordance with one or more aspects of the present invention.
Figure 8B:
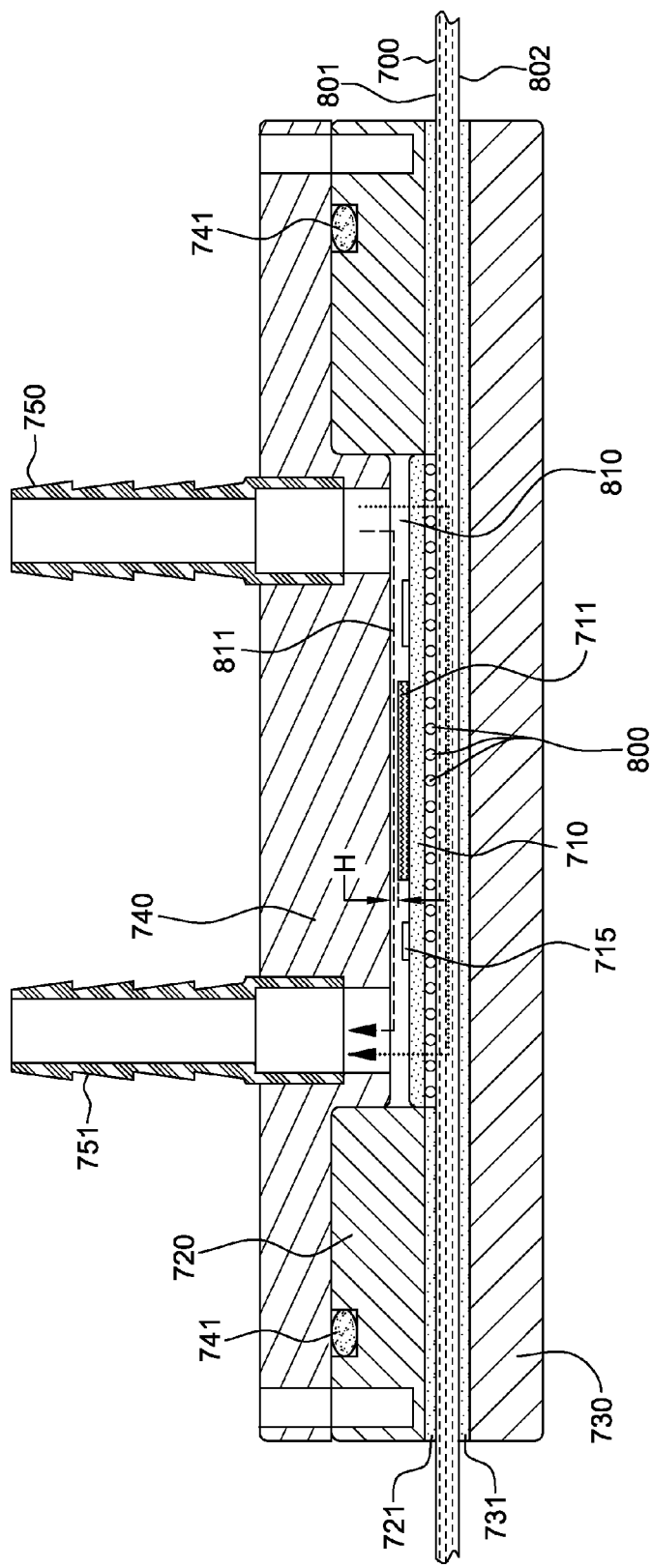
FIG. 8B is a cross-sectional elevational view of the assembly of FIG. 8A, taken along line 8B-8B thereof, in accordance with one or more aspects of the present invention.
Figure 8C:
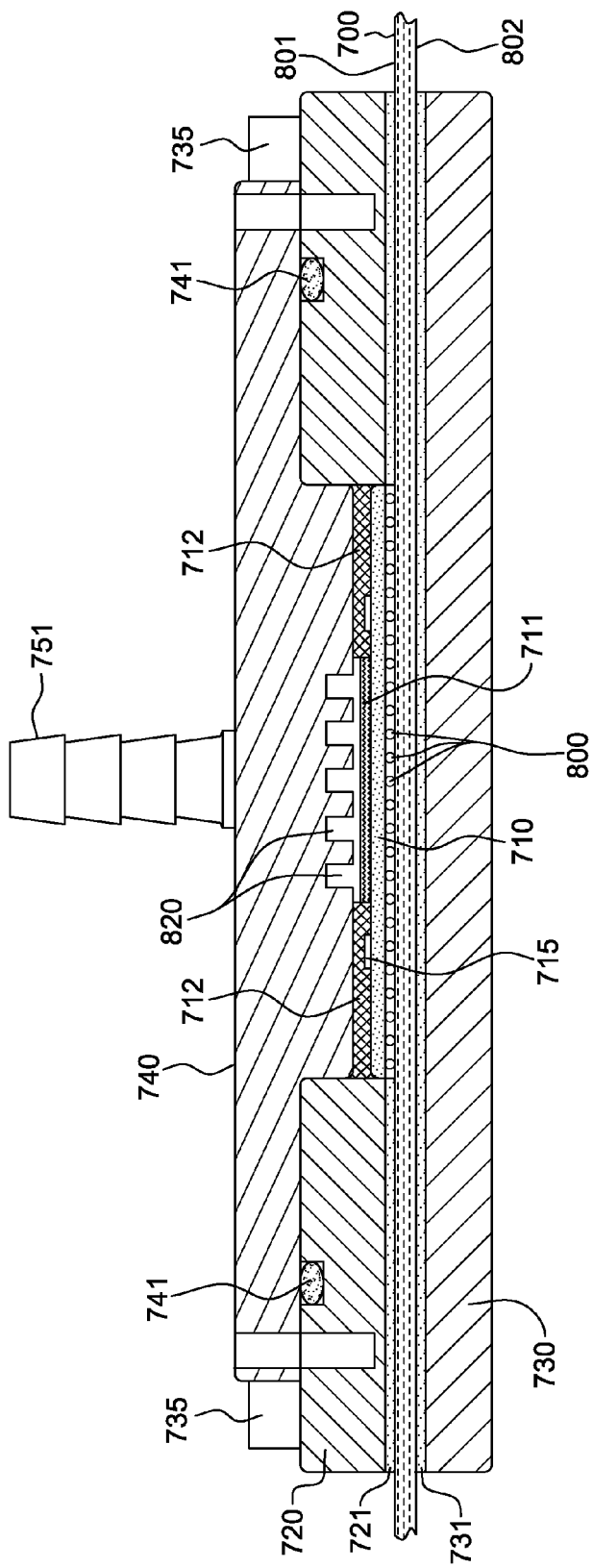
FIG. 8C is a cross-sectional elevational view of one embodiment of the assembly of FIG. 8A, taken along line 8C-8C thereof, in accordance with one or more aspects of the present invention.

FIG. 8A illustrates the assembled electronic component and housing assembly of FIG. 7, wherein a coolant-tight seal is formed at the opposite main sides of the printed circuit board 700 of the electronic system. FIGS. 8B & 8C depict cross-sectional elevational views of one embodiment of the assembled structure of FIG. 8A. As illustrated in these figures, second, lower frame 730 is secured via second adhesive layer 731 to second side 802 of printed circuit board 700, and first, upper frame 720 is secured in a coolant-tight manner to first side 801 of printed circuit board 700 via first adhesive layer 721. As noted, in one embodiment, adhesive layers 721, 731 comprise epoxy layers. By appropriately sizing first, upper frame 720 and second, lower frame 730 to extend a sufficient distance beyond the footprint of substrate 710 (to which the electronic components 711, 715 are mounted), a coolant-tight compartment 810 is defined, notwithstanding that the circuit board may be an organic board that is partially porous to the coolant. As illustrated, in this embodiment, substrate 710 electrically connects to printed circuit board 700 via one or more substrate-to-board electrical connections 800, such as solder bumps. Sealing gasket 741 facilitates a fluid-tight seal between cover 740 and first, upper frame 720. The configuration of cover 740 may be controlled such that the height ('H') of the coolant flow gap between the compartment 810 exposed, underside surface of cover 740 and the upper surface of, for example, electronic component 711, is sufficient for dielectric coolant to flow 811 across the electronic component and immersion-cool the electronic component, while also providing enhanced heat transfer to the coolant from the electronic component by restricting the flow space over the electronic component, and thereby facilitate flow boiling of the coolant.

One embodiment of the transverse cross-section of the assembly of FIG. 8A is illustrated in FIG. 8C, wherein multiple channels 820 are depicted within cover 740. These channels facilitate, in a two-phase implementation, egress of dielectric coolant vapor from the coolant flow gap or region over the electronic component(s). Note, however, that channels 820 are optional, particularly in the case where the cooling apparatus is to operate in single-phase cooling mode, in which case, it may be desirable to maintain a relatively narrow gap over the electronic components to be cooled so that the dielectric fluid passing through the housing assembly is forced into close proximity to the heated electronic components to facilitate extracting heat from the components.

The assembly of FIGS. 8A-8C may be further modified to include, for example, a boiling heat sink structure on the electronic component 711 being immersion-cooled, and/or to employ jet impingement of the dielectric fluid onto one or more surfaces of the electronic component to be cooled, for example, with peripheral or in situ, two-phase coolant removal. Advantageously, disclosed herein is a hybrid cooling approach to cooling an electronic system, wherein only selected electronic components of the electronic system are immersion-cooled using a pumped dielectric coolant. The balance of the electronic system may be air-cooled. In accordance with the cooling apparatus disclosed, the apparatus is a system or node-level apparatus, with the exception of the secondary, system coolant manifolds and lines required to feed system (or facility) coolant to the node-level heat exchangers. Housing assemblies are provided for forming fluid-tight seals about the opposite sides of a printed circuit board to which one or more components to be immersion-cooled are mounted within the electronic system. In one implementation, the printed circuit board may be a plastic an organic board, which may be somewhat porous to the dielectric coolant employed, and thus, the housing assembly is configure to seal to the board and provide a coolant-tight seal about the board, within at least the footprint of the electronic component to be cooled. Once the housing assembly seals the printed circuit board, the cooling apparatus disclosed herein provides pumped immersion-cooling of the selected components of the electronic system, and may function in either a single-phase or a two-phase cooling scheme.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A method of facilitating cooling of an electronic component, the method comprising:
   providing a housing assembly defining a compartment about the at least one electronic component, the at least one electronic component being coupled to a first side of a printed circuit board, and the providing of the housing assembly comprises:

providing a first frame comprising at least one opening sized to accommodate the at least one electronic component therein, and coupling the first frame to the first side of the printed circuit board employing a first adhesive layer between the first frame and the printed circuit board;

providing a second frame and coupling the second frame to a second side of the printed circuit board employing a second adhesive layer to seal the second frame to the second side of the printed circuit board, wherein the first side and the second side of the printed circuit board are opposite sides of the printed circuit board, wherein the printed circuit board is at least partially porous to a coolant to flow through the compartment for cooling the at least one electronic component, and wherein the first frame, the second frame, the first adhesive layer, and the second adhesive layer, are non-porous with respect to the coolant and provide a coolant-tight seal to the first side and the second side of the printed circuit board.

2. The method of claim 1, wherein the second frame comprises a plate, the plate being coupled to the second side of the printed circuit board in a position underlying the at least one electronic component coupled to the first side of the printed circuit board.

3. The method of claim 2, wherein the plate extends beyond a footprint of the at last one electronic component coupled to the first side of the printed circuit board, and the second adhesive layer is disposed between the second side of the printed circuit board and the plate, the second adhesive layer and the plate preventing the coolant from leaking from the second side of the printed circuit board in a region under the footprint of the at least one electronic component.

4. The method of claim 1, wherein the first adhesive layer comprises a first epoxy layer and the second adhesive layer comprises a second epoxy layer, and the first epoxy layer and the second epoxy layer respectively penetrate, at least partially, the first side and the second side of the printed circuit board.

5. The method of claim 1, wherein the at least one electronic component is mounted to a substrate and the substrate is mounted to the first side of the printed circuit board.

6. The method of claim 1, wherein the housing assembly further comprises a coolant inlet and a coolant outlet facilitating passing the coolant through the compartment, wherein the coolant is a dielectric coolant which immersion-cools the at least one electronic component.

7. The method of claim 6, further comprising providing:

a dielectric coolant loop coupled in fluid communication with the coolant inlet and coolant outlet of the housing assembly; and a dielectric coolant-to-secondary coolant heat exchanger coupled to the dielectric coolant loop and to a secondary coolant loop, the dielectric fluid coolant-to-secondary coolant heat exchanger facilitating dissipating heat extracted from the at least one electronic component by the dielectric coolant to secondary coolant within the secondary coolant loop.

8. The method of claim 6, wherein the housing assembly further comprises a cover sized and configured to seal to the first frame, and wherein the coolant inlet and the coolant outlet are disposed within the cover, and a coolant flow gap is defined between a surface of the cover and a surface of the at least one electronic component, the dielectric coolant flowing through the coolant flow gap.

9. The method of claim 8, further comprising providing at least one channel in the surface of the cover over the coolant flow gap, the at least one channel facilitating removal of coolant vapor from the compartment in a region of the coolant flow gap due to boiling of the dielectric coolant within the compartment.

10. The method of claim 8, further comprising providing a sealing gasket disposed between the first frame and the cover and providing a fluid-tight seal between the first frame and the cover.

11. The method of claim 1, wherein the housing assembly further comprises at least one foam structure disposed within the compartment to, at least in part, facilitating directing coolant flow within the compartment over the at least one electronic component.

* * * * *